United States Patent
Wu et al.

(10) Patent No.: US 9,142,630 B2
(45) Date of Patent: Sep. 22, 2015

(54) DEVICE PERFORMANCE ENHANCEMENT

(75) Inventors: Chang-Yu Wu, Hsin-chu (TW);
Chih-Chiang Chang, Hsin-chu (TW);
Shang-Chih Hsieh, Yangmei (TW);
Wei-Chih Hsieh, Taoyuan (TW)

(73) Assignee: Taiwan Semiconductor Manufacturing Co. Limited, Hsin-Chu (TW)

( * ) Notice: Subject to any disclaimer, the term of this patent is extended or adjusted under 35 U.S.C. 154(b) by 205 days.

(21) Appl. No.: 13/557,479

(22) Filed: Jul. 25, 2012

(65) Prior Publication Data
US 2014/0027821 A1    Jan. 30, 2014

(51) Int. Cl.
*H01L 21/28* (2006.01)
*H01L 29/423* (2006.01)
*H01L 29/78* (2006.01)

(52) U.S. Cl.
CPC ...... *H01L 29/4238* (2013.01); *H01L 21/28123* (2013.01); *H01L 29/78* (2013.01)

(58) Field of Classification Search
CPC ............ H01L 21/762; H01L 21/76264; H01L 23/5383; H01L 25/0652; H01L 25/0655; H01L 2924/15153; H01L 2924/15165; H01L 27/0207
USPC .............. 257/619; 438/107, 459, 977; 13/619
See application file for complete search history.

(56) References Cited

U.S. PATENT DOCUMENTS

| | | | | |
|---|---|---|---|---|
| 5,464,996 A | * | 11/1995 | Hynecek | 257/230 |
| 2011/0215390 A1 | * | 9/2011 | Kim et al. | 257/306 |
| 2011/0227188 A1 | * | 9/2011 | Wang et al. | 257/499 |
| 2012/0223392 A1 | * | 9/2012 | Okada | 257/369 |

OTHER PUBLICATIONS

"SST Nov. 2007: Intel's evolution: Strained silicon to high-k and metal gate", SolidState Technology, Nov. 2007, pp. 1-12, http://www.electroiq.com/articles/sst/2007/10/sst-november-2007-intels-evolution-strained-silicon-to-high-ik-i-and-metal-gate.html.

* cited by examiner

*Primary Examiner* — Stephen W Smoot
*Assistant Examiner* — Edward Chin
(74) *Attorney, Agent, or Firm* — Cooper Legal Group, LLC

(57) ABSTRACT

Among other things, one or more techniques for enhancing device (e.g., transistor) performance are provided herein. In one embodiment, device performance is enhanced by forming an extended dummy region at an edge of a region of a device and forming an active region at a non-edge of the region. Limitations associated with semiconductor fabrication processing present in the extended dummy region more so than in non-edge regions. Accordingly, a device exhibiting enhanced performance is formed by connecting a gate to the active region, where the active region has a desired profile because it is comprised within a non-edge of the region. A dummy device (e.g., that may be less responsive) may be formed to include the extended dummy region, where the extended dummy region has a less than desired profile due to limitations associated with semiconductor fabrication processing, for example.

18 Claims, 12 Drawing Sheets

DEVICE PERFORMANCE ENHANCEMENT

BACKGROUND

Generally, an integrated circuit comprises, among other things, an arrangement of a number of transistors, which are at times referred to as devices. For example, a standard integrated circuit cell (e.g., a logic gate, such as a NAND gate or a NOR gate) may comprise one or more transistors and/or one or more active regions. A transistor generally comprises a gate associated with an active region (e.g., active area, source, drain, well, etc.) to facilitate operation of the device. Transistors are generally formed as part of a semiconductor fabrication process where lithography and/or other techniques are used to fashion and/or operate on one or more layers of semiconductor and/or other types of material (e.g., via patterning, etching, doping, etc.) to establish and/or interconnect one or more devices.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Among other things, one or more techniques and/or systems for enhancing device performance are provided. In one embodiment, device performance is enhanced by forming an extended dummy region (e.g., extending a region) at an edge of a region of a device and forming an active region at a non-edge of the region. A device is formed by connecting a gate to the active region and exhibits enhanced performance at least because the active region comprises a desired region profile (e.g., enabled via forming the extended dummy region). According to one aspect, forming a dummy device comprising the extended dummy region facilitates performance enhancement at least because the dummy device mitigates use of an effective (e.g., comprising a non-desired profile) source and/or drain region (e.g., comprised within the extended dummy region). For example, a region may comprise a left edge, a right edge, and non-edge region(s). The left edge region and the right edge region are generally affected (e.g., in a negative manner) by limitations associated with semiconductor fabrication processes (e.g., rounding and/or effective formation effects), while the non-edge regions generally comprise a desired (e.g., rectangular) region profile. To this end, forming dummy device(s) comprising edge region(s) enables an enhanced performance device to be formed from the non-edge regions (e.g., comprising desired profiles).

To the accomplishment of the foregoing and related ends, the following description and annexed drawings set forth certain illustrative aspects and implementations. These are indicative of but a few of the various ways in which one or more aspects may be employed. Other aspects, advantages, and/or novel features of the disclosure will become apparent from the following detailed description when considered in conjunction with the annexed drawings.

DESCRIPTION OF THE DRAWINGS

Aspects of the disclosure may be understood from the following detailed description when read with the accompanying drawings. It will be appreciated that elements and/or structures of the drawings may not necessarily be drawn to scale. Accordingly, the dimensions of the various features may be arbitrarily increased and/or reduced for clarity of discussion.

DETAILED DESCRIPTION

Figure 1A:
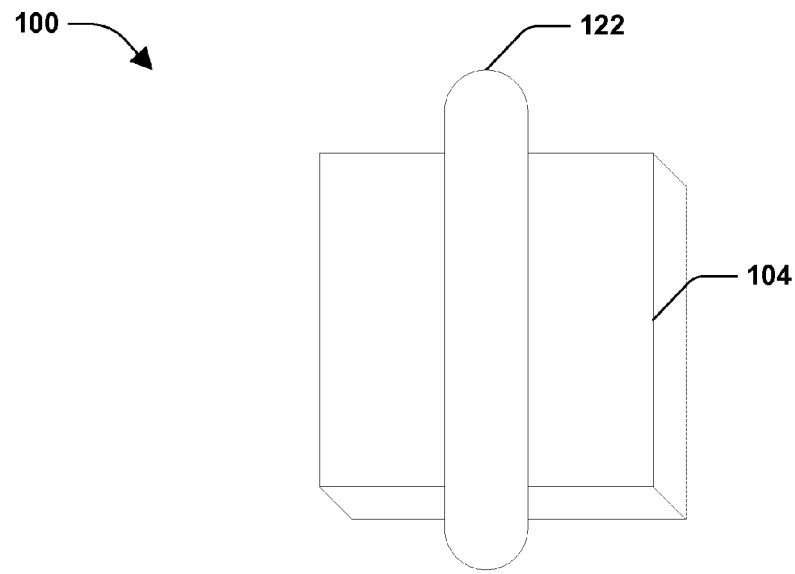
FIG. 1A is a top-down view of an example device comprising a desired profile.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are illustrated in block diagram form in order to facilitate describing the claimed subject matter.

During fabrication of devices (e.g., such as transistors, cells, logic gates, etc.), fabrication induced non-idealities may occur, such as from optical limitations associated with lithography (e.g., dimensions of features are smaller than wavelengths of light used in lithography), for example. Such non-idealities may include, for example, rounding of an active region, which may generally reduce an effective size (e.g., surface area, volume, etc.) of a transistor to a size smaller than a designed size (e.g., associated with a desired profile) for the transistor. Additionally, effective formation effects (e.g., associated with a structure of a transistor) may further reduce the effective size of the transistor at least due to lack of support from surrounding structures (e.g., gate, source, drain, etc.). A reduced transistor size generally decreases a driving strength and/or current associated with a device, thus producing unwanted delays in response time. Accordingly, as provided herein, an extended dummy region is formed on an edge of a region (e.g., active region) of a device to mitigate the impact of such fabrication induced non-idealities. A dummy gate may also be formed to address fabrication related non-idealities. To this end, a dummy device may be formed from the extended dummy region (e.g., comprising a non-desired profile) and/or the dummy gate, thus enabling a different (non-dummy) transistor to be formed from an active region and comprise a desired transistor profile, for example. The extended dummy region and/or the dummy gate may be biased to turn on the dummy device and provide an additional voltage source for at least a portion of a cell comprising the transistor (and possibly the dummy transistor as well). Additionally, the extended dummy region may be biased to mitigate leakage, for example. In this way, the extended dummy region and/or dummy gate may improve device and/or cell performance at least because the extended dummy region and/or dummy gate "consume" non-desired portions of a region, for example.

Figure 1B:
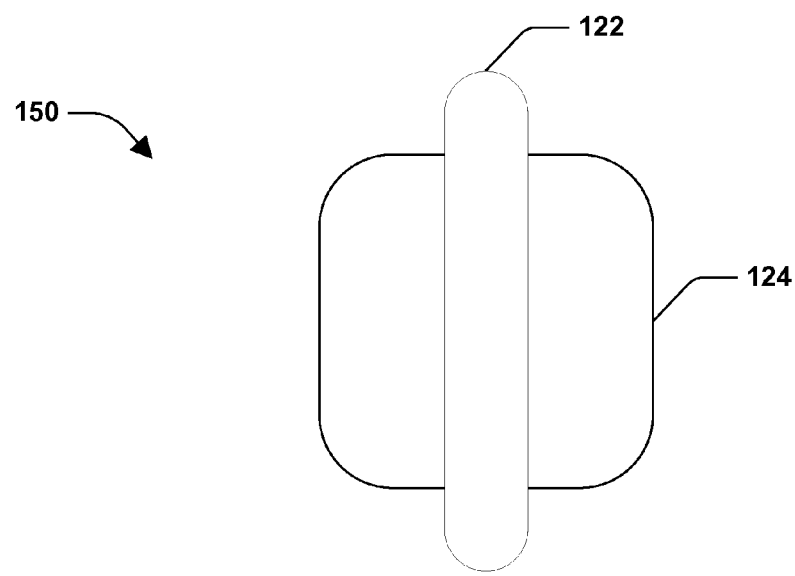
FIG. 1B is a top-down view of an example device comprising a non-desired profile.

FIG. 1A illustrates a top-down view of an example device 100 comprising a desired profile. Example device 100 is a transistor comprising a gate 122 and an active region 104. In one embodiment, the left portion of active region 104 comprises a source region and the right portion of active region 104 comprises a drain region. It will be appreciated that the active region 104 of transistor 100 comprises a desired profile at least because few rounding, effective formation, and/or growth effects are associated with the profile (e.g., thus forming a rectangular profile and/or a desired profile). Turning to FIG. 1B, transistor 150 comprises a gate 122 and an active region 124. However, the active region 124 is affected by rounding and/or effective formation effect, and thus does not comprise a desired profile at least because the active region 124 comprises rounded edges and/or a reduced effective area relative to active region 104 of FIG. 1A. Therefore, active region 124 comprises a reduced effective area (e.g., rounded edges associated with a growing process, etc.) relative to active region 104 of FIG. 1A, and is a non-desired profile.

Figure 2A:
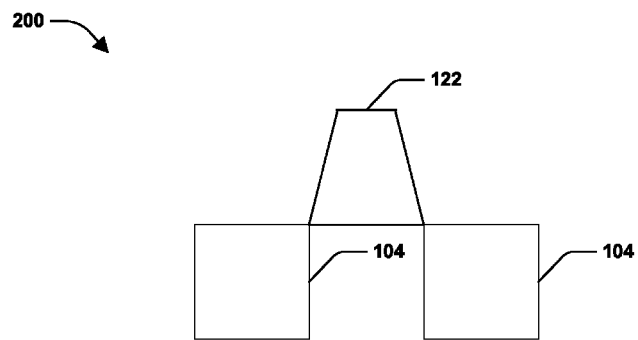
FIG. 2A is a cross-sectional view of an example device comprising a desired profile.
Figure 2B:
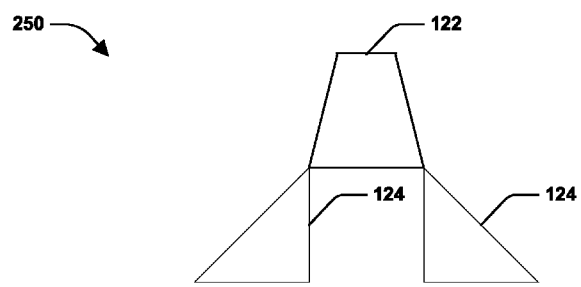
FIG. 2B is a cross-sectional view of an example device comprising a non-desired profile.

FIG. 2A illustrates a cross-sectional view of transistor 200 comprising gate 122 and active regions 104. In one embodiment the left active region comprises a source and the right active region comprises a drain, for example. Active regions 104 comprise a desired profile (e.g., desired region profile) at least because the active regions 104 appear square or rectangular from a cross sectional view. FIG. 2B illustrates a cross-sectional view of a transistor 250 affected by effective formation, comprising gate 122 and active regions 124 shaped according to effective formation and/or growth effects (e.g., comprising a non-desired profile). It will be appreciated that the active regions 124 do not comprise a desired profile at least because the structures appear to be collapsed and/or have rounded edges, in contrast to 'sharp' edges of active regions 104 of transistor 200 in FIG. 2A. For example, active region 124 associated with a non-desired profile appears to be approximately half the size of active region 104 comprising a desired profile. Therefore, transistor 200 of FIG. 2A provides quicker response times, better driving strength and current, while transistor 250 of FIG. 2B comprises a reduced amount of surface area and/or volume, thus providing an effective transistor that is smaller in size (e.g., and thus less responsive) than transistor 200 of FIG. 2A.

Figure 3:
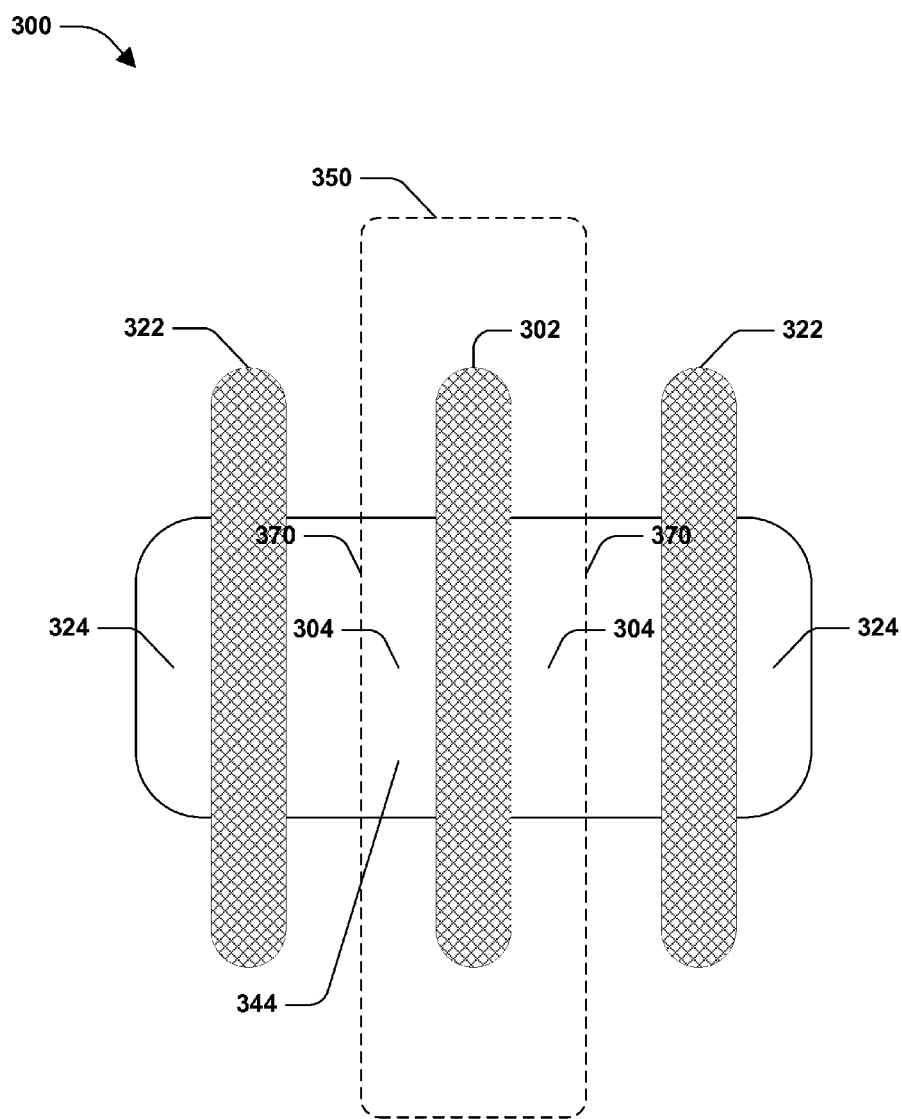
FIG. 3 is a top-down view of an example device configured to exhibit enhanced performance.

FIG. 3 illustrates a top-down view of an example device 300 exhibiting enhanced performance by way of extended dummy regions 324, for example. Region 344 comprises extended dummy regions 324 formed at edges 370 of active regions 304. In one embodiment, the active regions 304 may be extended from edges 370 to form extended dummy regions 324, for example. In another embodiment, extended dummy regions 324 are formed concurrently with active regions 304. According to one aspect, extended dummy regions 324 comprise non-desired profiles (e.g., a rounded profile and/or a profile indicative of effective formation), for example. Active regions 304, on the other hand, generally comprise a desired (e.g., rectangular) region profile when examined from a top-down view and/or a cross sectional view. At 350, the dashed line is indicative of a device (e.g., transistor) exhibiting enhanced performance formed from active regions 304 and gate 302. It will be appreciated that active regions 304 comprise desired profiles, while portions comprised in the remainder of device 300 comprise non-desired profiles (e.g., associated with rounding effects and/or effective formation effects). For example, extended dummy regions 324 appear rounded. Accordingly, transistor 350 comprises a more desired profile and a greater effective transistor size than a dummy transistor comprising dummy gate 322 and extended dummy region 324, for example. To this end, transistor 350 is configured to provide enhanced performance based on a desired transistor profile (e.g., comprising a desired region profile).

Figure 4:
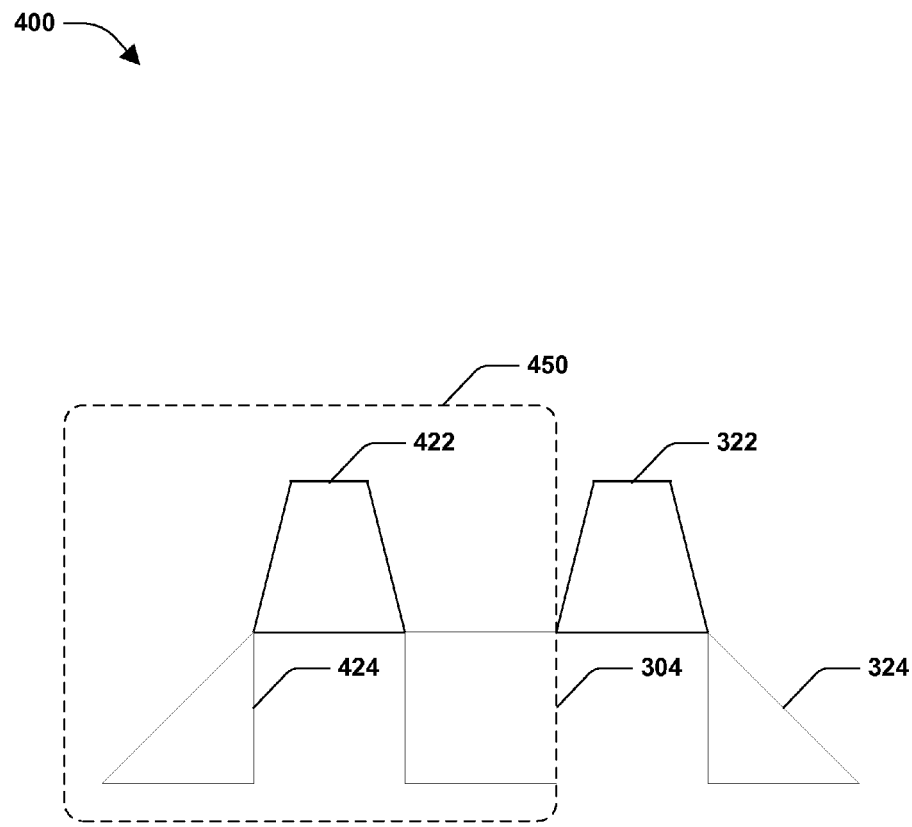
FIG. 4 is a cross-sectional view of an example device configured to exhibit at least some enhanced performance.

According to one aspect, a transistor may comprise a portion associated with a desired profile and a portion associated with a non-desired profile. For example, FIG. 4 illustrates a cross-sectional view 400 of a device exhibiting at least some enhanced performance. At 450, the dashed line indicates a functional (e.g., operational transistor) portion of the device, while dummy gate 322 and extended dummy region 324 comprise a non-functional portion of the device 400. To this end, transistor 450 comprises an active region 424 comprising a non-desired profile (e.g., non-rectangular, rounded, and/or affected by effective formation effects, etc.) and an active region 304 comprising a square or rectangular (e.g., desired) profile. In one embodiment, extended dummy region 324 is formed by extending active region 304. For example, since rounding and/or effective formation affects edge regions (e.g., extended dummy region), active region 304 may be extended to form extended dummy region 324 such that the extended dummy region is affected (e.g., negatively and comprising a non-desired profile) by fabrication non-idealities, thus mitigating such non-idealities within the active region 304 (e.g., and thus providing active region 304 with a desired profile). In this example, extended dummy region 324 "absorbs" edge effects to mitigate undesirable effects associated with fabrication from affecting active region 304 (e.g., thus enabling active region 304 to substantially maintain a rectangular profile and/or a desirable profile), for example. In the illustrated example, gate 422 is connected to active region 424 and active region 304 to form transistor 450. Even though the transistor 450 comprises gate 422 and active region 424 comprising a non-ideal profile, the transistor exhibits at least some enhanced performance due to the presence of the active region 304 comprising a desired profile, at least relative to a transistor that comprises no desired profiles (e.g., a non-desired region profile).

Figure 5:
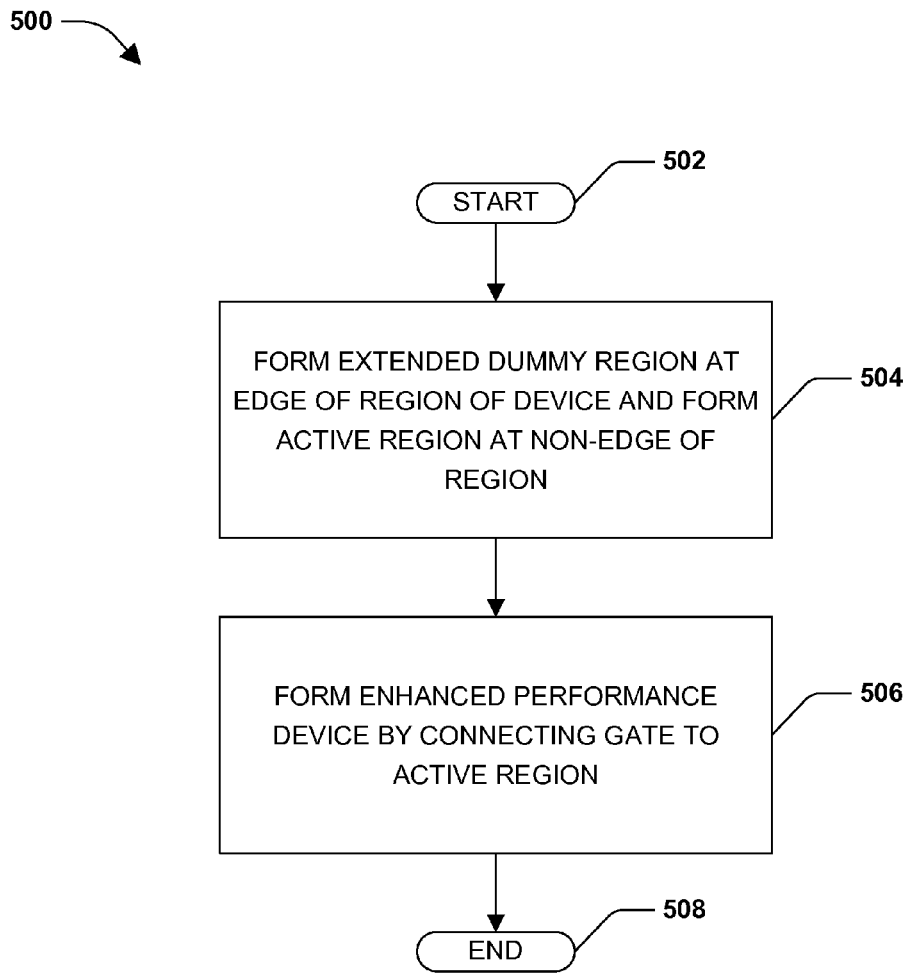
FIG. 5 is a flow diagram of an example method for enhancing performance of a device.

One embodiment of enhancing and/or improving device performance is illustrated by example method 500 in FIG. 5. At 502, the method starts. At 504, an extended dummy region is formed at an edge of a region of a device and an active region is formed at a non-edge region of the device. In one embodiment, a region is formed comprising an active region at a non-edge of the region and an extended dummy region at an edge of the region. In one embodiment, the active region and the extended dummy region are formed of the same layer in a concurrent fashion and of the same material. According to one aspect, the extended dummy region is formed at the edge of the active region at a different time than the active region. Additionally, it will be appreciated that the extended dummy region can be formed of a different material than the active region. At 506, a device exhibiting enhanced performance is formed by connecting a gate to the active region. It is to be appreciated that one or more gates mentioned in this application can comprise polysilicon, which may or may not be doped and/or annealed. Similarly, one or more regions, active regions, extended regions and/or dummy regions, etc. mentioned herein can be formed within a substrate, epitaxial layer, etc., and can comprise implants, such as dopants, for example. Additionally, in one example, a channel region is defined between active regions and below a gate in a transistor. Also, in one example, a gate dielectric material is located above a channel region but below a gate in a transistor. At 508, the method ends.

Figure 6:
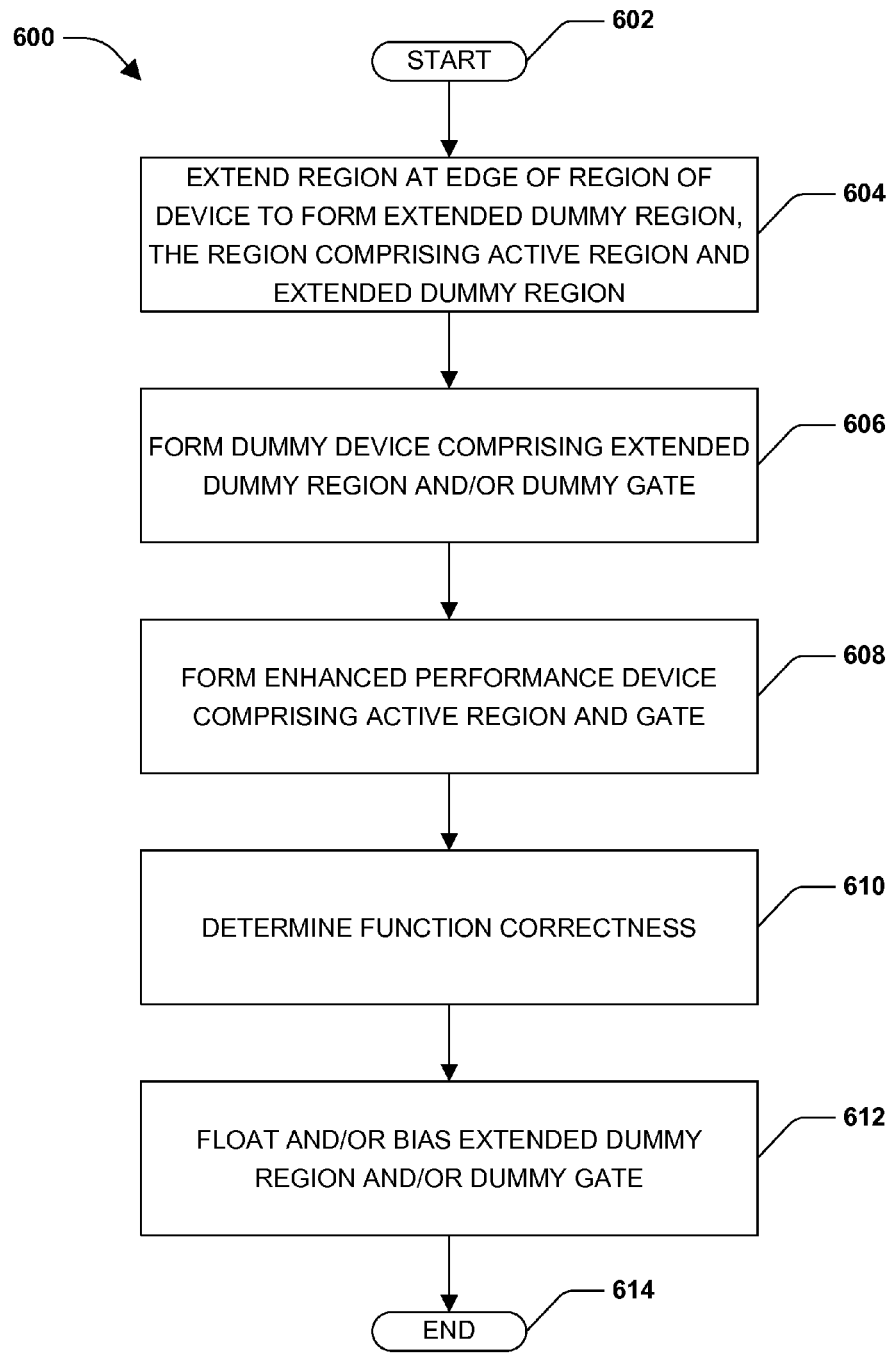
FIG. 6 is a flow diagram of an example method for enhancing performance of a device.

FIG. 6 illustrates an example method for enhancing performance of a device, and begins at 602. At 604, an extended dummy region is formed by extending a region at an edge of the region. In one embodiment, the region comprises an active region and the extended dummy region. For example, the region may comprise one or more active regions (e.g., 424 and 304 of FIG. 4) and extended dummy regions (e.g., 324 of FIG. 4). According to one aspect, the extended dummy region is formed concurrent to forming the region and/or forming the active region. Alternatively, the extended dummy region may be formed at a different time and/or of a different material than when the region and/or active region is formed. It will be appreciated that a region may be extended on one side (e.g., a single side, such as merely 324 of FIG. 4) or on multiple sides (e.g., both sides, such as 324 of FIG. 3), for example.

At 606, a dummy device is formed, and comprises the extended dummy region. In one embodiment, the dummy device comprises the extended dummy region and a dummy gate. For example, in FIG. 3, the devices not encircled by the dashed line form dummy devices. That is, for example, referring to FIG. 3, dummy gate 322 and extended dummy region 324 form a first dummy device on the left of transistor 350. Additionally, a second dummy device is formed to the right of transistor 350 comprising dummy gate 322 and extended dummy region 324. In one embodiment, a dummy device formed at 606 is not functionally active (e.g., not used as an operational transistor, for example). It will be appreciated that a single dummy device may be formed, or multiple dummy devices may be formed, based on physical layouts, etc.

At 608, a device exhibiting enhanced performance is formed, the device comprising an active region (e.g., associated with a desired region profile and comprising a source region and/or a drain region) and a gate. In one embodiment, merely a portion of a transistor comprises a desired profile. For example, in FIG. 4, active region 304 comprises a desired profile, while active region 424 comprises a non-desired profile. To this end, a device exhibits enhanced performance at least because at least one of the active regions comprise an effective transistor size larger (e.g., closer to a designed transistor size and/or associated with a desired transistor profile) than an effective transistor size without a dummy transistor, as illustrated by an example in FIG. 2B, thereby providing more current flow and a quicker response time, for example.

At 610, function correctness (e.g., as will be described in more detail herein) is determined. In one embodiment, function correctness comprises biasing a dummy gate based on a cell design and/or layout of a cell (e.g., FIG. 11), where a cell may be referred to as a device. For example, biasing a dummy gate in one direction may cause cell logic to produce an incorrect output. That is, for example, if a dummy gate associated with a NAND cell is biased in a first direction, an undesirable result may be produced (e.g., if the NAND cell is given zero as a first input and zero is also input at a second input, the NAND cell may produce an incorrect output of zero). Accordingly, the dummy gate in this example is biased in a second direction based at least in part on the determined function correctness. According to one aspect, function correctness is determined based on a topology of a device, such as a logic gate, cell, etc., for example. For example, it is desirable to bias an extended dummy region and a dummy gate for a NAND cell in one direction and less desirable to bias such features, elements, etc. for a NOR cell in the other direction. To this end, determining function correctness 610 facilitates a determination of biasing arrangements, for example. In one embodiment, determining function correctness comprises checking performance and/or leakage, for example, associated with a device for one or more biasing arrangements and determining a desired biasing arrangement based on the checked performance and/or leakage.

At 612, an extended dummy region and/or a dummy gate is floated and/or biased. In one embodiment, the extended dummy region and dummy gate are floated, as illustrated in FIG. 3. In another embodiment, the extended dummy region is biased and the dummy gate is floated (e.g., FIG. 8). It will be appreciated that biasing an extended dummy region may mitigate current leakage. In another embodiment, the extended dummy region is biased and the dummy gate is biased using a single bias (e.g. FIG. 9). In yet another embodiment, the extended dummy region is biased and the dummy gate is biased using a separate bias achieved based on a poly cut (e.g., FIG. 10). To this end, biasing a dummy gate turns a dummy device (e.g., dummy transistor) on and thus provides an additional voltage source for a PMOS and/or NMOS portion of a cell (e.g., as will be described in more detail in FIG. 10). At 614, the method 600 ends.

Figure 7:
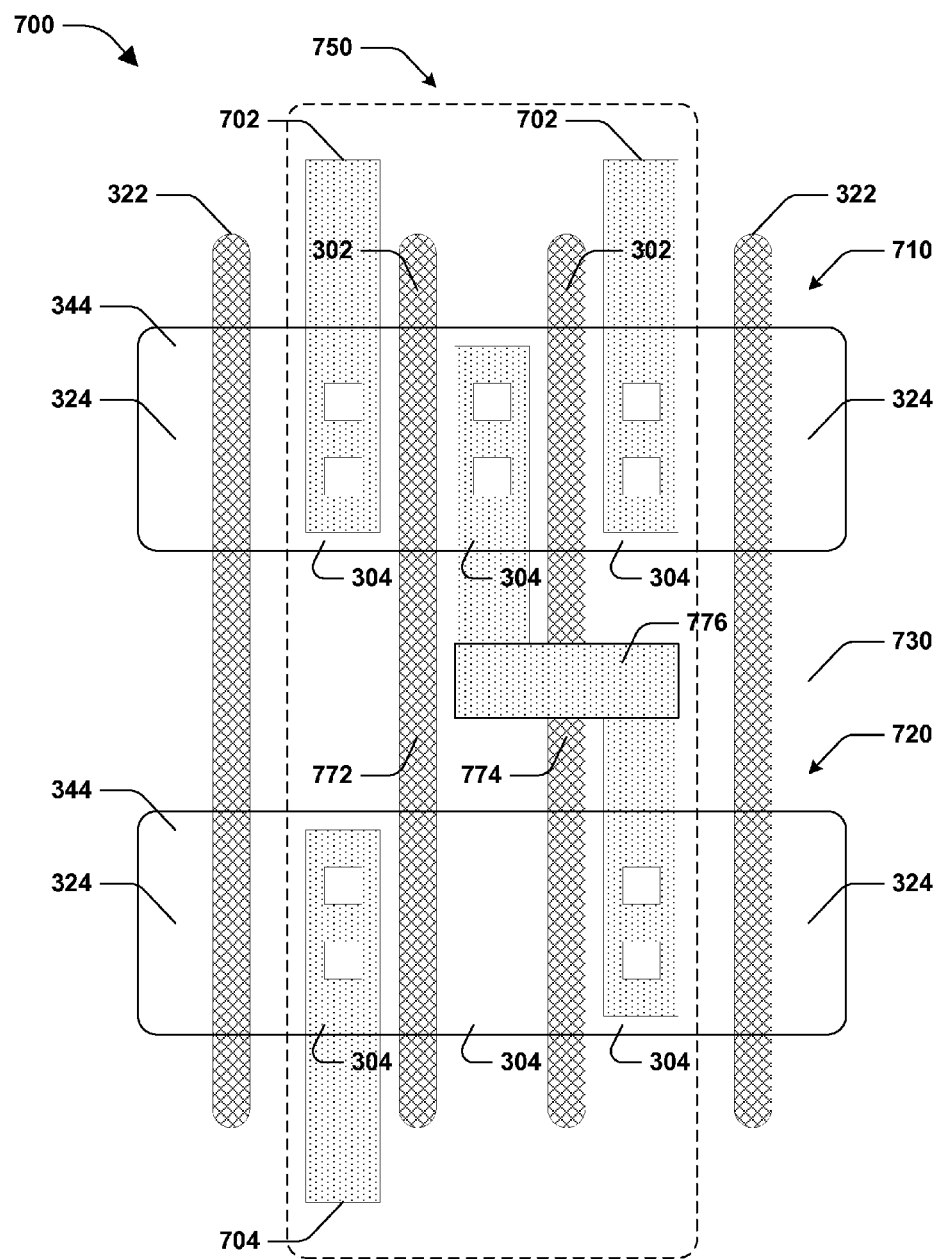
FIG. 7 is a top-down view of an example cell configured to exhibit enhanced performance.

FIG. 7 is a top-down view 700 of an example NAND cell (e.g., NAND gate) 750 exhibiting enhanced performance. The operational (e.g., functional) portion of the NAND cell 750 (e.g., encircled in phantom) comprises a PMOS (e.g., top) portion 710, an NMOS (e.g., bottom) portion 720, input A 772, input B 774, and output 776. In one embodiment, the PMOS portion 710 is located away from the NMOS portion 720 and divided via substrate 730. Positive supply voltage VDD 702 is connected to the source of PMOS transistor(s) 710 to supply power to the PMOS via active regions 304 comprising PMOS source regions. Negative supply voltage VSS 704 is connected to the source of an NMOS transistor 720 to supply power to the NMOS via active region 304 comprising an NMOS source region. In one embodiment, the PMOS portion 710 is separated from the NMOS portion 720 via dielectric (e.g., layered over the substrate 730). According to one aspect, the PMOS portion 710 of NAND cell 750 comprises region 344. Region 344 comprises active regions 304 of the PMOS transistor(s) 710 and extended dummy regions 324 not operationally used (e.g., functionally) by NAND cell 750. In this example, extended dummy regions 324 are extended on multiple (e.g., left and right) sides of region 344. For example, turning to the PMOS portion 710 of the NAND cell 750, region 344 comprises a left extended dummy region 324 and a right extended dummy region 324. It will be appreciated that extended dummy region(s) 324 may be extended from a single side (e.g., left side or right side) and/or multiple (e.g., both) sides of region 344. In one embodiment, extended dummy regions 324 are extended in region 344 at an edge of an active region 304. Generally, extended dummy regions 324 comprise a non-desired profile (e.g., rounded profile, profile associated with effective formation effects, and/or non-rectangular profiles), while active regions 304 comprise a desired (e.g., more square, rectangular, etc.) profile. Similarly, the NMOS portion 720 of the NAND cell 750 comprises a region 344. Region 344 of the NMOS portion 720 comprises active regions 304 and extended dummy regions 324.

It will be appreciated that a functional portion of the NAND cell 750 (e.g., encircled by dashed lines) merely comprises active regions 304 and gates 302, while extended dummy regions 324 and dummy gates 322 are not comprised within the functional portion of the NAND cell 750. To this end, dummy regions 324 and dummy gates 322 may be configured to form dummy devices (e.g., comprising non-desired transistor profiles and exhibiting less than enhanced performance at least due to rounding and/or effective formation effects). Since NAND cell 750 comprises active regions 304 associated with desired (e.g., rectangular) profiles, NAND cell 750 comprises a transistor size similar to a designed transistor size (e.g., associated with enhanced performance), while the dummy devices (e.g., dummy transistors) comprise a reduced transistor size at least because of rounding effects and/or effective formation effects on respective dummy source and/or drain regions. In this way, enhanced performance is provided for a functional portion of NAND cell 750, by extending extended dummy regions 324 and/or providing dummy gates 322.

Figure 8:
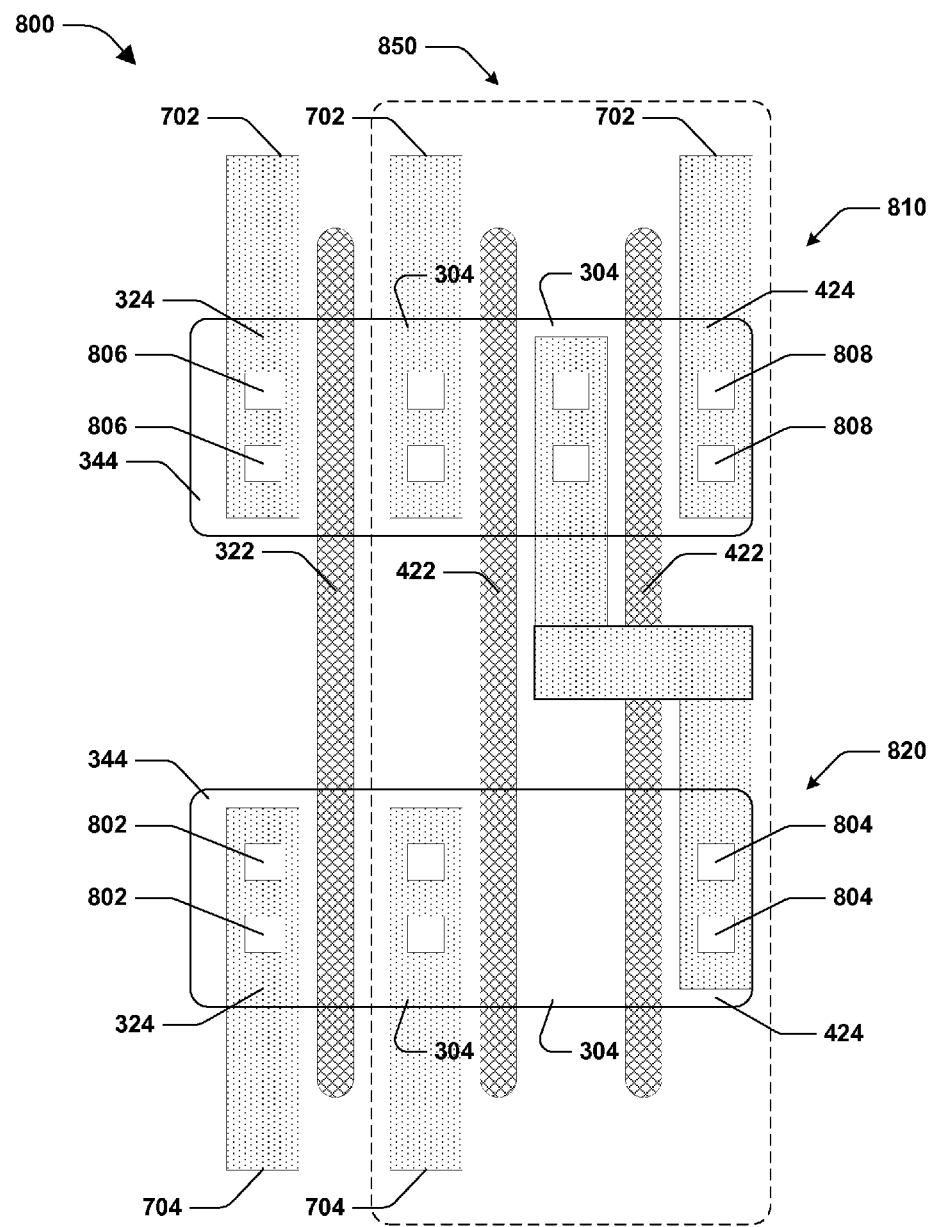
FIG. 8 is a top-down view of an example cell configured to exhibit enhanced performance.

FIG. 8 illustrates a top-down view 800 of an example NAND cell 850 exhibiting enhanced performance (e.g., with an operational (e.g., functional) portion encircled in phantom). In this example, extended dummy regions 324 are extended merely from a left side of regions 344 for respective PMOS 810 and NMOS 820 portions of NAND cell 850. Additionally, the extended dummy regions 324 of this example are biased based on a connection to the PMOS portion 810 or a connection to the NMOS portion 820 and/or cell design. For example, in one embodiment, the extended dummy region 324 of the PMOS portion 810 is connected to positive supply voltage (e.g., bias high) VDD 702 by contacts 806, while extended dummy region 324 of the NMOS portion 820 is connected to negative supply voltage (e.g., bias low) VSS 704 by contacts 802. According to one aspect, biasing the extended dummy region 324 of the PMOS portion 810 high and biasing the extended dummy region 324 of the NMOS portion 820 low enables cell 850 to mitigate leakage by having leakage current flow from the left side of the cell to the right side of the cell for the PMOS portion 810 and vice versa for the NMOS portion 820 (e.g., towards a source of respective PMOS and/or NMOS portions, thus enabling leakage current to contribute to the device, for example). It will be appreciated that biasing to the supplies VDD 702 and/or VSS 704 and contacts 802, 804, 806, and/or 808 may be routed (e.g., with vias) through any layers (e.g., ME1, ME2, etc.).

According to one aspect, NAND cell 850 comprises gates 422. In one embodiment, these gates 422 comprise respective inputs for the NAND cell 850. The PMOS portion 810 of the NAND cell 850 comprises active regions 304 comprising desired profiles, an active region 424 comprising a non-desired profile (e.g., affected by rounding and/or effective formation), and gates 422. In one embodiment, active region 424 comprises a source region connected to VDD 702 via contacts 808. The NMOS portion 820 of the NAND cell 850 comprises active regions comprising desired profiles 304, an active region 424 comprising a non-desired profile, and gates 422. According to one aspect, contacts 804 connect active region 424 of the NMOS portion 820 to an output of the NAND cell 850. In one embodiment, active region(s) 424 are associated with non-desired profiles, while active regions 304 are associated with desired profiles at least because the active region 424 is located at an edge of region 344, for example. To this end, NAND cell 850 exhibits enhanced performance at least because extended dummy regions 324 "absorb" at least some fabrication non-idealities (e.g., rounding and/or effective formation) such that NAND cell 850 is comprised of at least some square or rectangular profile active regions. Additionally, NAND cell 850 exhibits enhanced performance at least because respective extended dummy regions 324 are biased to mitigate leakage accordingly.

Figure 9:
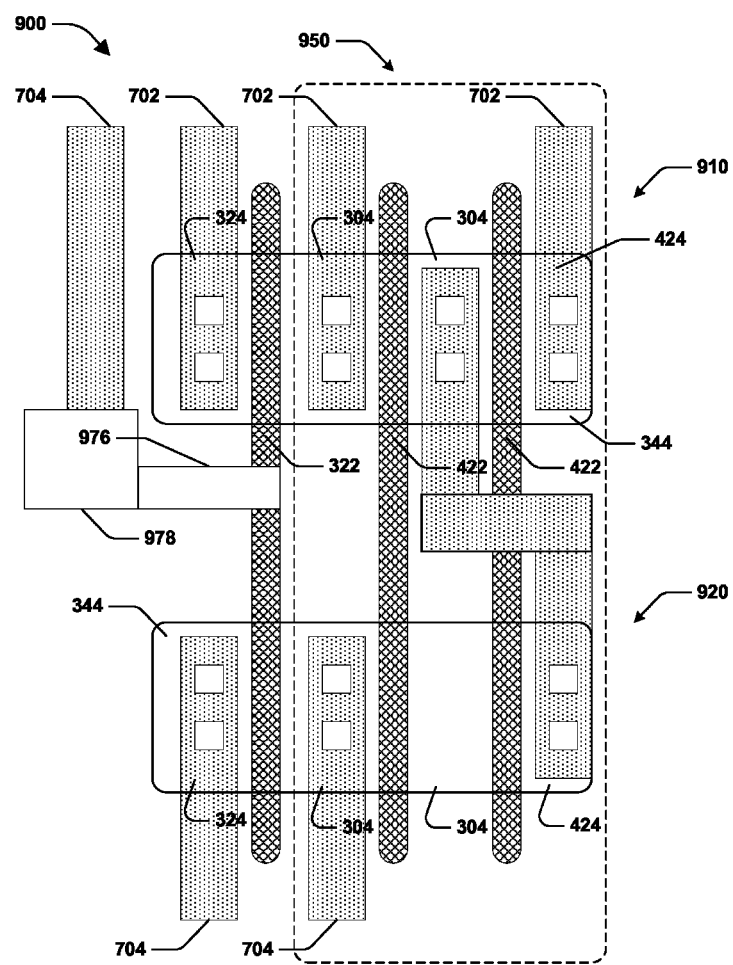
FIG. 9 is a top-down view of an example cell configured to exhibit enhanced performance.

FIG. 9 illustrates a top-down view 900 of an example NAND cell 950 exhibiting enhanced performance based on a single bias (e.g., with an operational (e.g., functional) portion encircled in phantom). In this example, extended dummy regions 324 are extended from regions 344 for respective PMOS 910 and NMOS 920 portions. Additionally, extended dummy regions 324 are biased to VDD 702 and VSS 704 for PMOS 910 and NMOS 920 portions, respectively. Furthermore, this example provides for dummy gate biasing via gate connection 976 and tie low cell 978 to form a connection (e.g., single bias) with negative supply voltage VSS 704, for example. In one embodiment, dummy gate 322 is connected to VSS via gate connection 976 without use of tie low cell 978. To this end, biasing the dummy gate 322 low (e.g., via the connection to VSS 704) turns a dummy PMOS device (e.g., comprising extended dummy region 324 and dummy gate 322) on, to provide an additional voltage source for the PMOS portion 910 of NAND cell 950 (e.g., in conjunction with appropriate extended dummy region biasing).

Figure 10:
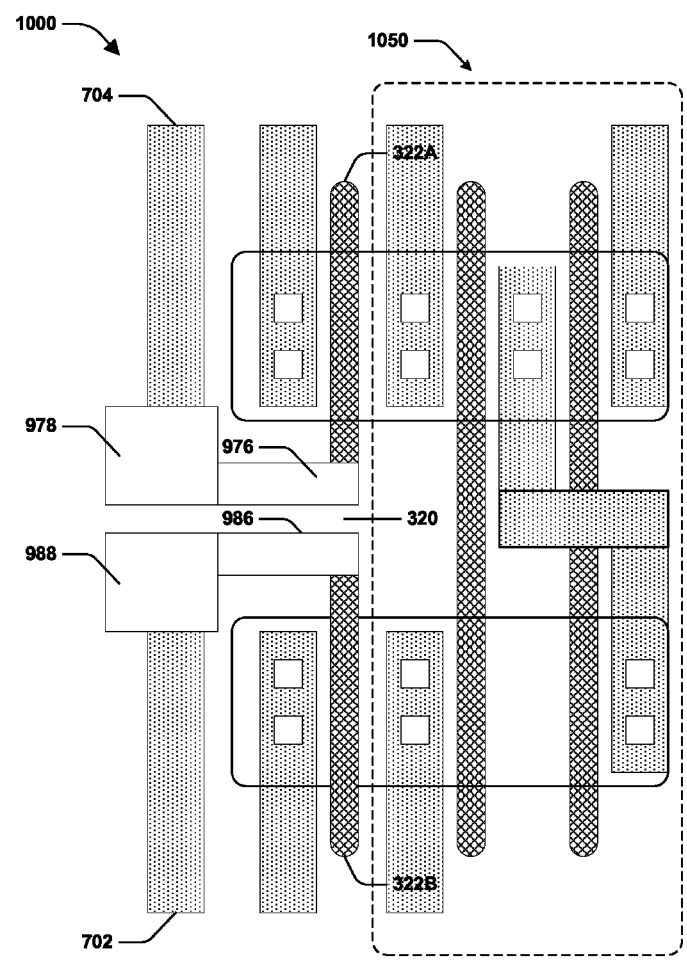
FIG. 10 is a top-down view of an example cell configured to exhibit enhanced performance.

FIG. 10 illustrates a top-down view 1000 of an example NAND cell 1050 exhibiting enhanced performance based on a separate bias of a dummy gate 322 (e.g., with an operational (e.g., functional) portion encircled in phantom). In this example, a poly cut 320 enables a dummy gate to be divided into a first portion 322A and a second portion 322B, and biased accordingly (e.g., using separate bias). For example, the first portion of dummy gate 322A (e.g., corresponding to a PMOS portion of the NAND cell) is biased low (e.g., a first direction) by connecting the first portion of the dummy gate 322A to gate connector 976, tie low cell 978, and to negative supply voltage 704. In one embodiment, poly cut 320 enables a dummy PMOS (e.g., comprising the first portion of the dummy gate 322A) to be turned on to provide NAND cell with an additional voltage source. Poly cut 320 also enables the second portion of dummy gate 322B (e.g., corresponding to an NMOS portion of the NAND cell) to be biased high (e.g., a second direction) by connecting the second portion of the dummy gate 322B to gate connector 986, tie high cell 988, and to positive supply voltage 702. According to one aspect, biasing a dummy NMOS device high (e.g., via second dummy gate 322B) enables the dummy NMOS to act as an additional voltage source for NAND cell 1050. To this end, the poly cut 320 enables respective dummy gate portions to be biased accordingly (e.g., in multiple directions, such as low for PMOS and/or high for NMOS) such that respective dummy devices are turned on for respective portions of the cell, thus providing additional voltage sources for NAND cell 1050.

Figure 11:
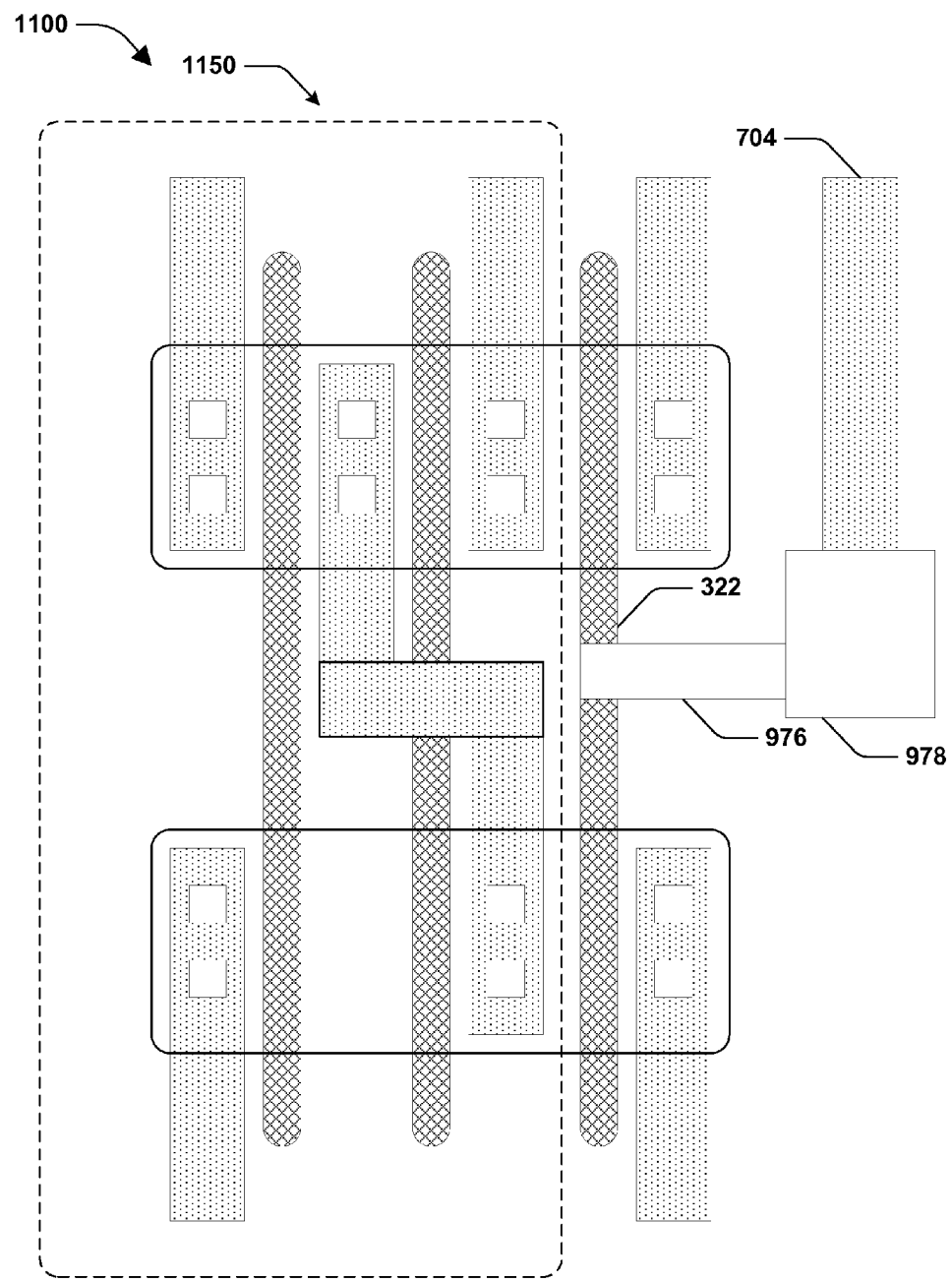
FIG. 11 is a top-down view of an example cell configured to exhibit enhanced performance.

FIG. 11 is a top-down view 1100 of an example NAND cell 1150 exhibiting enhanced performance (e.g., with an operational (e.g., functional) portion encircled in phantom). In this example, function correctness is determined for dummy gate 322. In this embodiment, the source of the PMOS (e.g., top) portion is located on the right side of the PMOS. Additionally, the drain side of the NMOS (e.g., bottom) portion is located on the right side of the NMOS. If dummy gate 322 is biased high, a dummy PMOS device on the right side of the cell 1150 is turned off and a corresponding dummy NMOS device on the NMOS portion of the cell 1150 is turned on, thereby forming an additional (e.g., non-desired) NMOS device. To this end, turning the dummy NMOS gate and/or device on is not desired at least because the dummy NMOS will be connected to the NAND cell 1150 (e.g., forming an additional undesired discharge path and/or create a short), and thus disrupt outputs associated with the NAND cell and provide outputs inconsistent with a NAND cell truth table, for example.

Figure 12:
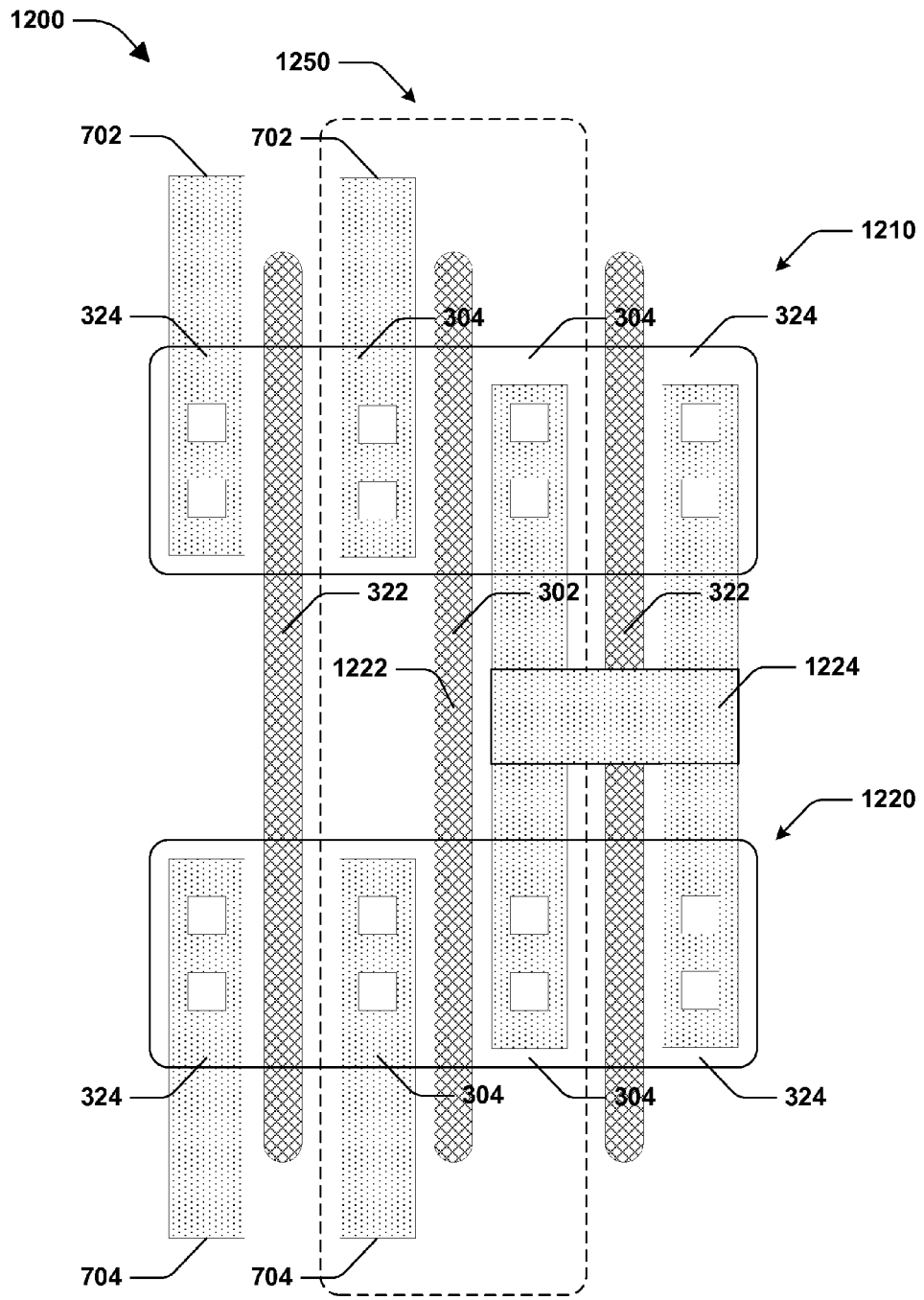
FIG. 12 is a top-down view of an example cell configured to exhibit enhanced performance.

FIG. 12 is a top-down view 1200 of an example inverter cell (INV) 1250 exhibiting enhanced performance (e.g., with an operational (e.g., functional) portion encircled in phantom). In this example, INV 1250 comprises active regions 304 comprising desired profiles at least because the active regions 304 have been extended to form extended dummy regions 324 associated with rounded profiles and/or effective formation profiles. In this example, dummy gate 322 is floating. The input 1222 of INV 1250 is located on gate 302, while the output of the INV 1250 is located at 1224. It will be appreciated that an extended dummy region 324 on a left side of a PMOS portion 1210 of the INV 1250 is biased high to VDD 702 to facilitate providing the PMOS portion 1210 of the INV 1250 with an additional voltage source. Additionally, this example also provides an extended dummy region 324 on the left side of the NMOS portion 1220 of the INV 1250 biased to VSS 704 to provide the NMOS portion 1220 of the INV 1250 with an additional voltage source. In one embodiment, the extended dummy regions 324 (e.g., drain regions) on the right side of respective PMOS and NMOS portions are connected to the output 1224 to of INV 1250, for example. Additionally, in one example, the source regions are connected to VDD and/or VSS for respective PMOS and/or NMOS portions of INV 1250. In this example, an enhanced response time is provided at least by providing extended dummy regions 324 and by biasing respective extended dummy regions. To this end, INV 1250 response time is improved by around five pico-seconds (e.g., a nine percent performance enhancement compared with an inverter without extended dummy regions and/or biasing).

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc. (e.g., gates, dummy gates, regions, active regions, dummy regions, etc.) depicted herein are illustrated with particular dimensions relative to one another (e.g., structural dimensions and/or orientations) for purposes of simplicity and ease of understanding and that actual dimensions of the same may differ substantially from that illustrated herein. Additionally, layers features, elements, etc. may be formed in any number of suitable ways, such as with implanting techniques, doping techniques, spin-on techniques, sputtering techniques (e.g., magnetron or ion beam sputtering), growth techniques (e.g., thermal) and/or deposition techniques such as chemical vapor deposition (CVD), for example.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, at least one of A and B and/or the like generally means A or B or both A and B.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to merely one of several implementations, such feature may be combined with one or more other features of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An arrangement comprising:
    a device, comprising:
        an active region disposed within a substrate; and
        a gate disposed above the substrate and functionally coupled to the active region;
        an extended dummy region disposed within the substrate; and
        a dummy gate disposed above the substrate and between the active region and the extended dummy region, the dummy gate abutting the substrate.

2. The arrangement of claim 1, comprising a connection layer configured to connect the extended dummy region to at least one of $V_{DD}$ or $V_{SS}$.

3. The arrangement of claim 1, comprising a connection layer configured to connect the dummy gate to at least one of $V_{DD}$ or $V_{SS}$.

4. The arrangement of claim 1, wherein the active region is doped with a first dopant and the extended dummy region is doped with a second dopant.

5. An arrangement, comprising:
    a device comprising:
        a first gate;
        a second gate;
        a first active region shared between the first gate and the second gate; and
        a second active region functionally coupled to the second gate; and
        a dummy gate at an edge of the second active region.

6. The arrangement of claim 5, comprising a third active region functionally coupled to the first gate, wherein the first active region is a PMOS portion of the device and the third active region is an NMOS portion of the device.

7. The arrangement of claim 5, comprising a first contact region for connecting the first active region to a first supply voltage.

8. The arrangement of claim 5, comprising an extended dummy region disposed within a substrate in which the first active region and the second active region are disposed.

9. The arrangement of claim 8, wherein the dummy gate is above the substrate and between the second active region and the extended dummy region.

10. The arrangement of claim 8, comprising a first contact region for connecting the extended dummy region to a first supply voltage.

11. The arrangement of claim 8, wherein the extended dummy region is doped with a dopant.

12. The arrangement of claim 11, wherein the second active region is doped with the dopant.

13. The arrangement of claim 5, comprising:
 a gate connection region for connecting the dummy gate to a voltage supply to bias the dummy gate.

14. The arrangement of claim 5, comprising a first contact region for connecting the second active region to a voltage supply.

15. The arrangement of claim 14, comprising a second contact region for connecting the first active region to the voltage supply.

16. The arrangement of claim 13, comprising a tie low cell connected to the gate connection region.

17. An arrangement, comprising:
 a device, comprising:
  a first active region disposed within a substrate;
  a second active region disposed within the substrate; and
  a first gate disposed above the substrate; and
  a second gate disposed above the substrate, the first active region disposed between the first gate and the second gate;
 an extended dummy region disposed within the substrate; and
 a dummy gate disposed above the substrate and between the second active region and the extended dummy region.

18. The arrangement of claim 17, wherein the extended dummy region is doped with a first dopant.

* * * * *